US 9,781,370 B2

(12) United States Patent
Reverchon et al.

(10) Patent No.: US 9,781,370 B2
(45) Date of Patent: Oct. 3, 2017

(54) PIXEL OF A CMOS IMAGER OF AN OPTICAL DETECTOR

(71) Applicants: THALES, Neuilly sur Seine (FR); Commissariat a l'energie atomique et aux energies alternatives, Paris (FR)

(72) Inventors: Jean-Luc Raymond Reverchon, Palaiseau (FR); Eric Belhaire, Elancourt (FR); Philippe Bois, Palaiseau (FR)

(73) Assignees: THALES, Neuilly sur Seine (FR); COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 15/025,197

(22) PCT Filed: Sep. 17, 2014

(86) PCT No.: PCT/EP2014/069803
§ 371 (c)(1),
(2) Date: Mar. 25, 2016

(87) PCT Pub. No.: WO2015/044014
PCT Pub. Date: Apr. 2, 2015

(65) Prior Publication Data
US 2016/0241801 A1    Aug. 18, 2016

(30) Foreign Application Priority Data

Sep. 27, 2013    (FR) ...................................... 13 02261

(51) Int. Cl.
*H04N 5/335*    (2011.01)
*H04N 5/374*    (2011.01)
*H01L 27/146*   (2006.01)

(52) U.S. Cl.
CPC ....... *H04N 5/374* (2013.01); *H01L 27/14609* (2013.01); *H01L 27/14612* (2013.01); *H01L 27/14649* (2013.01); *H01L 27/14652* (2013.01)

(58) Field of Classification Search
None
See application file for complete search history.

(56) References Cited

U.S. PATENT DOCUMENTS

2010/0072349 A1    3/2010    Veeder

FOREIGN PATENT DOCUMENTS

| FR | 2966976 A1 | 5/2012 |
| FR | 2966978 A1 | 5/2012 |
| WO | 2006/073875 A2 | 7/2006 |
| WO | 2015044014 A1 | 4/2015 |

OTHER PUBLICATIONS

Preliminary Search Report for FR 1302261 dated May 8, 2014.

*Primary Examiner* — Stephen Coleman
(74) *Attorney, Agent, or Firm* — Thompson Coburn LLP

(57) ABSTRACT

The invention relates to a pixel of a CMOS imager, the pixel comprising:
  an infrared photodiode suitable for generating an electric current when it is exposed to an optical radiation having a wavelength greater than 950 nanometers,
  a conversion circuit able to receive electrons and deliver a voltage with a value varying as a function of the number of received electrons,
  a first switch connected between the infrared photodiode and the conversion circuit.

23 Claims, 5 Drawing Sheets

PIXEL OF A CMOS IMAGER OF AN OPTICAL DETECTOR

CROSS-REFERENCE TO RELATED APPLICATIONS

This application is a 35 U.S.C. §371 National Phase of International Patent Application No. PCT/EP2014/069803, filed Sep. 17, 2014, which claims the benefit of French application FR 13 02261, filed Sep. 27, 2013, each of which is incorporated herein by reference in its entirety.

The present invention relates to a pixel of a CMOS imager, a CMOS imager comprising at least one such pixel and a camera comprising such an imager.

Many applications in the security field involve detecting light beams having low light levels, typically between 1 μLux and 1 mLux. It is therefore desirable to have detectors allowing the detection of low light levels in an extended spectral range also having other functionalities, such as detecting laser spots or hot spots.

To that end, it is in particular known in the state of the art to have two different detection circuits, one for a first spectral range, for example the visible, the other for the second spectral range, for example the infrared. For the circuit associated with the second spectral range, according to one known electrical diagram, an infrared photodiode is connected directly at the input of a three-transistor read circuit. The three-transistor read circuit is used to read and convert the current produced by the infrared photodiode.

However, the circuit has significant read noise.

One aim of the invention is therefore to propose an imager pixel making it possible to reduce the read noise while using, as a read circuit, the basic structure of the highest performing visible CMOS imagers.

To that end, the invention relates to a pixel of an imager, the pixel comprising an infrared photodiode suitable for generating an electric current when it is exposed to an optical radiation having a wavelength greater than 950 nanometers (nm), a conversion circuit able to receive electrons and to deliver a voltage with a value varying as a function of a number of received electrons, and a first switch connected between the infrared photodiode and the conversion circuit.

According to other embodiments, the pixel comprises one or more of the following features, considered alone or according to any technically possible combinations:
  the infrared photodiode has no silicon.
  the infrared photodiode is made from a semiconductor made of materials belonging to columns IIIA and VA of the periodic table.
  the pixel further comprises an electron reservoir connected between the infrared photodiode and the first switch and a first diffusion node connected between the first switch and the conversion circuit, the first switch being movable between an open position and a closed position, the reservoir and the first diffusion node being connected in the closed position.
  the reservoir is chosen from among a group made up of a second diffusion node, and a buried photodiode.
  the infrared photodiode comprises two electrodes, one of the two electrodes being connected to the reservoir.
  the reservoir is a buried photodiode and the imager further comprises a second switch connected between the infrared photodiode and the buried photodiode.
  the pixel further comprises a second diffusion node connected between the infrared photodiode and the second switch, the second switch being movable between an open position and a closed position, the reservoir and the second diffusion node being connected in the closed position.
  the infrared photodiode comprises two electrodes and the first switch comprises a control input of the first switch, one of the two electrodes of the infrared photodiode being connected to the control input of the first switch.

Also proposed is a CMOS imager comprising a plurality of pixels, at least one of the pixels being as previously described.

The invention also relates to a CMOS imager comprising a plurality of pixels, each pixel being as previously described.

Also proposed is a camera comprising at least one CMOS imager as previously described.

Also proposed is a pixel of a CMOS imager, the pixel comprising:
  an infrared photodiode suitable for generating an electric current when it is exposed to an optical radiation having a wavelength greater than 950 nanometers (nm),
  a conversion circuit able to receive electrons and deliver a voltage with a value as varying a function of the number of received electrons,
characterized in that the pixel further comprises:
  a first switch connected between the infrared photodiode and the conversion circuit,
  an electron reservoir,
  a first diffusion node connected between the first switch and the conversion circuit,
  the first switch being movable between an open position and a closed position, the reservoir and the first diffusion node being connected in the closed position, the electron reservoir being a buried photodiode.

According to other embodiments, the pixel comprises one or more of the following features, considered alone or according to any technically possible combinations:
  the infrared photodiode has no silicon.
  the infrared photodiode is made from a semiconductor with a base of materials from columns IIIA and VA of the periodic table.
  the infrared photodiode comprises two electrodes, one of the two electrodes being connected to the reservoir.
  the imager further comprises a second switch connected between the infrared photodiode and the buried photodiode.
  the pixel further comprises a second diffusion node connected between the infrared photodiode and the second switch, the second switch being movable between an open position and a closed position, the reservoir and the second diffusion node being connected in the closed position.
  the infrared photodiode comprises two electrodes and the first switch comprises a control input of the first switch, one of the two electrodes of the infrared photodiode being connected to the control input of the first switch.

Other features and advantages of the invention will appear upon reading the following description of embodiments of the invention, provided solely as non-limiting examples and in reference to the appended drawings, in which.

Figure 1:
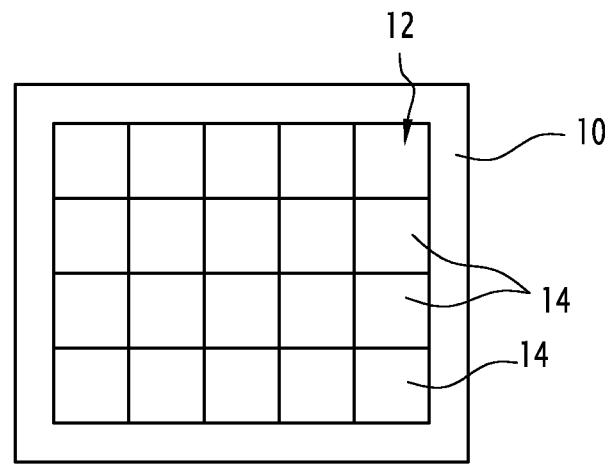
FIG. 1 is a diagrammatic illustration of a camera according to the invention, the camera comprising an imager comprising a plurality of pixels.

The camera 10 shown in FIG. 1 is suitable for detecting optical radiation whereof the wavelength(s) belong(s) to several spectral ranges.

As an illustration, the wavelengths of the working spectral range of the camera 10 are comprised in the visible and infrared domains. For example, the wavelengths of the working spectral range are comprised between 400 nanometers (nm) and 1.7 micrometers (μm).

The camera 10 comprises an imager 12 and one or more mechanical elements making it possible to ensure the maintenance and protection of the imager 12.

Alternatively, the camera 10 also comprises at least one mechanical element making it possible to modify the position of the imager 12 (case of detectors 10 dedicated to a surveillance application).

According to still another alternative, the camera 10 comprises a plurality of superimposed imagers 12 and mechanical elements, for example for maintenance, protection or position modification.

The imager 12 is able to convert an optical image into an electronic signal.

In the case of the invention, the imager 12 is a CMOS imager. The expression "CMOS imager" refers to an imager whereof the components are CMOS components. A CMOS component is a component manufactured using CMOS technology, the acronym CMOS standing for "Complementary Metal Oxide Semiconductor".

The imager 12 comprises a matrix of pixels 14. For example, the imager 12 comprises a matrix of 256 by 256 pixels 14, i.e., 65,536 pixels 14.

Furthermore, according to the example of FIG. 1, each pixel 14 is identical. As a result, only one pixel 14 is described below.

Figure 2:
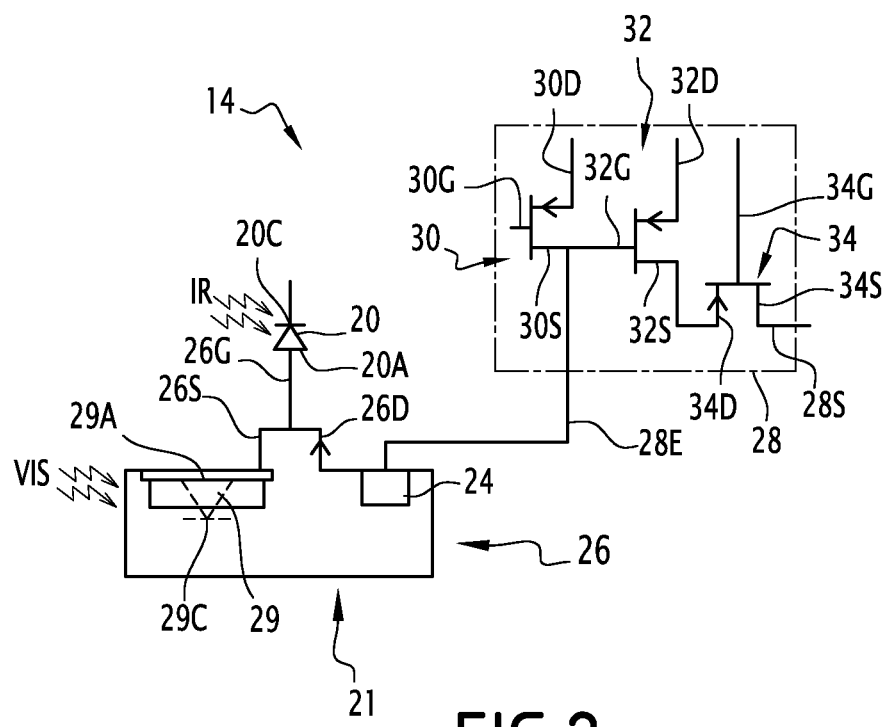
FIG. 2 is a diagrammatic illustration of a pixel of FIG. 1 according to a first embodiment of the invention.

According to a first embodiment shown in FIG. 2, the pixel 14 comprises an infrared photodiode 20, an electron reservoir 21, a first diffusion node 24, also called first floating diffusion node 24, a first switch 26, also called load transfer switch 26, and a voltage conversion circuit 28.

The infrared photodiode 20 is suitable for generating an electric current when it is exposed to radiation with a wavelength greater than 950 nanometers (nm). The radiation is diagrammed in FIG. 2 by two arrows topped by the indication IR.

Preferably, the infrared photodiode 20 is suitable for generating electric current only when it is exposed to radiation whereof the wavelength is comprised between 950 nm and 1700 nm.

The infrared photodiode 20 has no silicon. It is for example made from a semiconductor with a base of materials from columns IIIA and VA of the periodic table.

A semiconductor of type "III-V" is a composite semiconductor made from one or more elements from column IIIA of the periodic table of elements (boron, aluminum, gallium, indium, etc.) and one or more elements from column VA, or pnictogens (nitrogen, phosphorus, arsenic, antimony, etc.).

As an example, the infrared photodiode 20 is an assembly of three layers of indium phosphide (chemical formula InP), indium arsenide and gallium (chemical formula InGaAs) and indium phosphide (chemical formula InP).

Alternatively, the infrared photodiode 20 is made with a base of cadmium telluride and mercury (HgCdTe).

The infrared photodiode 20 comprises two electrodes: an anode 20A and a cathode 20C.

The electron reservoir 21 is, in the example of FIG. 2, a buried photodiode 29. The buried photodiode 29 comprises silicon and is suitable for generating an electric current only when it is exposed to radiation whereof the wavelength is comprised in the visible band (400 nm to 800 nm). The buried photodiode 29 comprises two electrodes: an anode 29A and a cathode 29C.

According to the example of FIG. 2, the diffusion node 24 is an N-doped layer.

The transfer switch 26 is for example a MOSFET transistor (Metal Oxide Semiconductor Field Effect Transistor).

A MOSFET transistor comprises a gate electrode, a drain electrode and a source electrode, also called gate, drain and source. Hereinafter, the gate, drain and source electrodes of the transistor are respectively identified by placing the letters G, D and S, respectively, next to the reference sign of the transistor.

The gate 26G of the transfer switch 26 is connected to the anode 20A of the infrared photodiode 20; the source 26S of the transfer switch 26 is connected to the anode 29A of the buried photodiode 29; and the drain 26D of the transfer switch 26 is connected to the first diffusion node 24.

The transfer switch 26 is movable between an open position and a closed position. In the closed position, the buried photodiode 29 and the first diffusion node 24 are connected.

The conversion circuit 28 comprises an input 28E and an output 28S.

The input 28E is connected to the first diffusion node 24.

The conversion circuit 28 is able to deliver, to the output 28S, a voltage with a value varying as a function of the number of electrons received at the input 28E.

As an example, the conversion circuit 28 is a so-called "three-transistor" circuit.

The conversion circuit 28 comprises a reset transistor 30, a line selection transistor 32 and a follower transistor 34.

Each of the three transistors 30, 32, 34 is a transistor of the MOSFET type.

The source 30S of the reset transistor 30 is connected to the input 28E of the conversion circuit 28 and the gate 32G of the line selection transistor 32.

The source 32S of the line selection transistor 32 is connected to the drain 34D of the follower transistor 34.

The operation of the pixel 14 visible in FIG. 2 will now be described.

An optical radiation having a wavelength comprised between 950 nm and 1700 nm illuminates the infrared photodiode 20.

In response, the infrared photodiode 20 generates an electric current proportional to the intensity of the received optical radiation.

The generated electric current is injected at the gate 26G of the transfer switch 26.

When the transfer switch 26 receives a current whose intensity is sufficient to modify its position, the transfer switch 26 is then placed in the closed position. In this position, the buried photodiode 29 and the first diffusion node 24 being connected, an electron transfer is created from the buried photodiode 29 toward the first diffusion node 24.

The position of the transfer switch 26, and therefore the number of electrons transferred toward the first diffusion node 24, depends on the electric current generated by the infrared photodiode 20.

The first diffusion node 24 thus accumulates electrons as a function of the intensity of the optical radiation received by the infrared photodiode 20.

These accumulated electrons are next converted into voltage by the conversion circuit 28.

Such a pixel 14 therefore makes it possible to read and convert the current of the infrared photodiode 20 in response to the optical radiation having a wavelength comprised between 950 nm and 1700 nm.

Furthermore, due to the presence of the transfer switch 26, the read and conversion steps of the signal of the infrared photodiode 20 are successive over time and not simultaneous.

As a result, the read step has reduced noise relative to the state of the art. This is in particular reflected by a reduced dark current.

Furthermore, relative to components made using CCD (Charge-Coupled Device) technology, such a CMOS imager 12 has the advantage of having equally good performance with a lower manufacturing cost.

Figure 3:
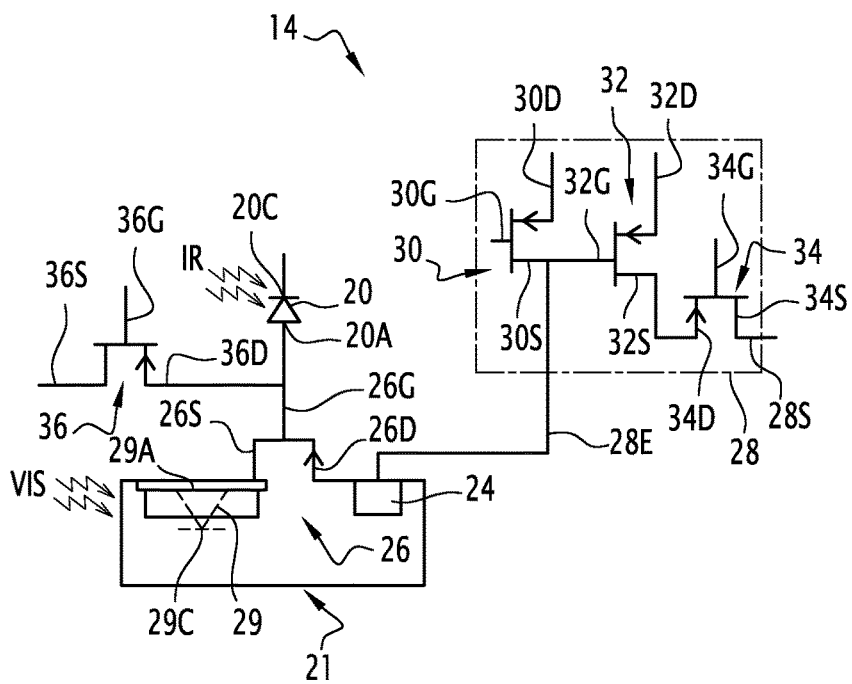
FIGS. 3 to 9 are views similar to those of FIG. 2 according to second, third, fourth, fifth, sixth, seventh and eighth respective embodiments.

According to a second embodiment as shown in FIG. 3, the pixel 14 comprises the same elements as the pixel 14 according to the first embodiment described in light of FIG. 2.

The pixel 14 further comprises a reset switch 36.

The reset switch 36 is a MOSFET transistor.

The drain 36D of the reset switch 36 is connected to the anode 20A of the infrared photodiode 20 and to the gate 26G of the transfer switch 26.

The operation of the pixel 14 shown in FIG. 3 is similar to the operation of the pixel 14 shown in FIG. 2.

Furthermore, the reset switch 36 makes it possible to reset the infrared photodiode 20 to recondition (i.e., reset) the load transfer conditions from the visible photodiode to the first diffusion node 24 before the conversion of the accumulated electrons into voltage by the conversion circuit 28.

This prevents accumulation in the infrared photodiode 20 of stray electrons not converted into accumulated electrons in the first diffusion node 24.

Figure 4:
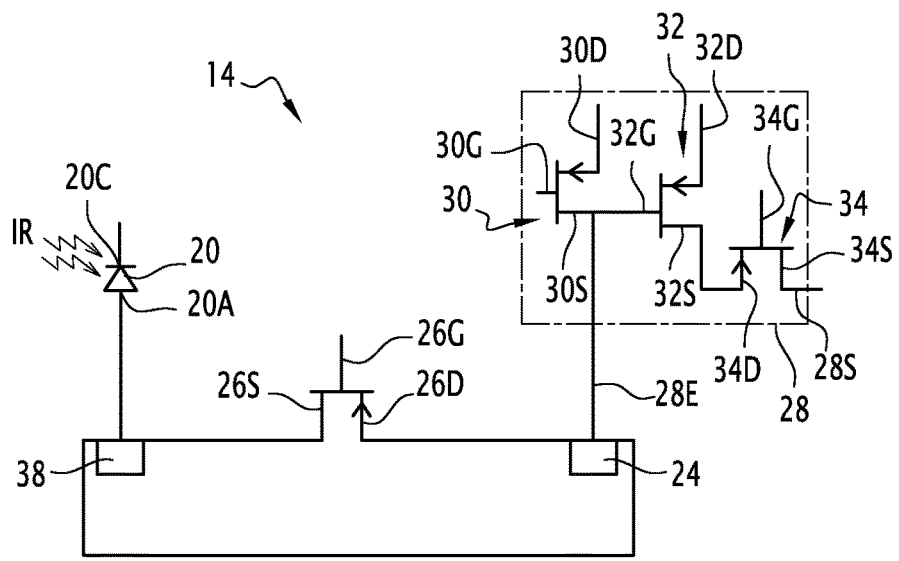

According to a third embodiment as shown in FIG. 4, the elements identical to the pixel 14 according to the first embodiment described in light of FIG. 2 are not repeated. Only the differences are discussed.

In this third embodiment, the reservoir 21 is a second diffusion node 38, also called second floating diffusion node 38, instead of the buried photodiode 29.

Furthermore, the anode 20A of the infrared photodiode 20 is connected to the second diffusion node 38 instead of being connected to the gate 26G of the transfer switch 26.

The operation of the pixel 14 shown in FIG. 4 will now be described.

An optical radiation having a wavelength comprised between 950 nm and 1700 nm illuminates the infrared photodiode 20.

In response, the infrared photodiode 20 generates an electric current proportional to the intensity of the received optical radiation.

The generated electric current is injected at the second diffusion node 38.

Electrons accumulate in the second diffusion node 38.

Then, the transfer switch 26 is placed in the closed position. The second diffusion node 38 and the first diffusion node 24 then being connected, an electron transfer is then created from the second diffusion node 38 toward the first diffusion node 24.

The number of electrons transferred toward the first diffusion node 24 depends on the electric current generated by the infrared photodiode 20.

The first diffusion node 24 thus accumulates electrons as a function of the intensity of the optical radiation received by the infrared photodiode 20.

These accumulated electrons are next converted into voltage by the conversion circuit 28.

Figure 5:
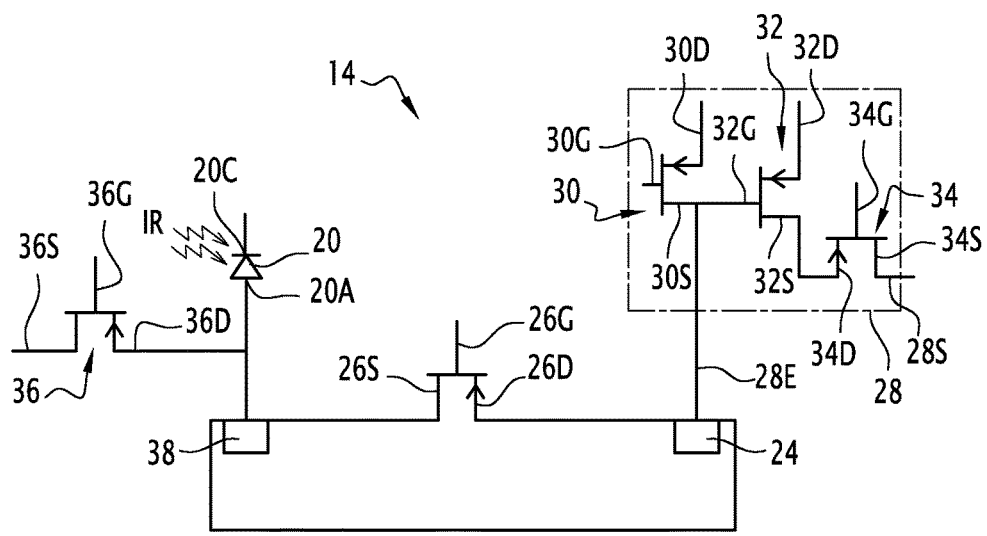

According to a fourth embodiment as shown in FIG. 5, the pixel 14 comprises the same elements as the pixel 14 according to the third embodiment described in light of FIG. 4.

The pixel 14 further comprises a reset switch 36.

The reset switch 36 is a MOSFET transistor.

The drain 36D of the reset switch 36 is connected to the anode 20A of the infrared photodiode 20 and the second diffusion node 38.

The operation of the pixel 14 shown in FIG. 5 is similar to the operation of the pixel 14 shown in FIG. 4.

Furthermore, the reset switch 36 makes it possible to reset the infrared photodiode 20 to recondition (i.e., reset) the load transfer conditions from the visible photodiode to the first diffusion node 24 before the conversion of the accumulated electrons into voltage by the conversion circuit 28.

This prevents accumulation in the infrared photodiode 20 of stray electrons not converted into accumulated electrons in the first diffusion node 24.

Figure 6:
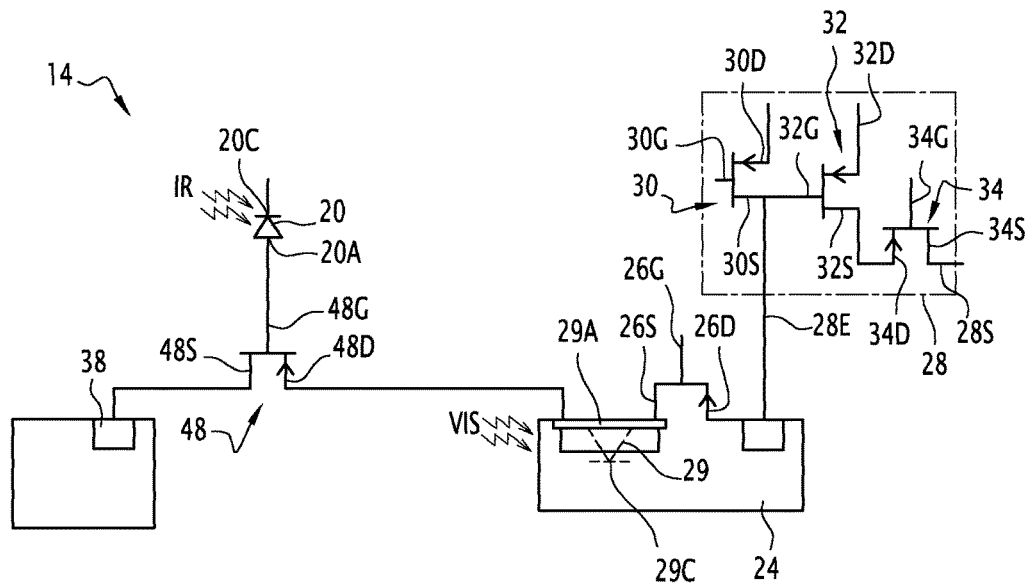

According to a fifth embodiment as shown in FIG. 6, the elements identical to the pixel 14 according to the first embodiment of FIG. 2 are not repeated. Only the differences are discussed.

In this case, the pixel 14 also comprises a second diffusion node 38 and a second switch 48, also called drain switch 48.

The drain switch 48 is a MOSFET transistor.

The drain 48D of the drain switch 48 is connected to the buried photodiode 29, while the source 48S of the drain switch 48 is connected to the second diffusion node 38.

The drain switch 48 is movable between an open position and a closed position. In the closed position, the buried photodiode 29 and the second diffusion node 24 are connected.

Furthermore, the anode 20A of the infrared photodiode 20 is connected to the gate 48G of the drain switch 48.

The operation of the pixel 14 shown in FIG. 6 will now be described.

An optical radiation having a wavelength comprised between 950 nm and 1700 nm illuminates the infrared photodiode 20.

In response, the infrared photodiode 20 generates an electric current proportional to the intensity of the received optical radiation.

The generated electric current is injected at the gate 48G of the drain switch 48.

When the drain switch 48 receives a current whose intensity is sufficient to modify its position, the drain switch 48 is placed in the closed position. In this position, the second diffusion node 38 and the buried photodiode 29 being connected, an electron transfer is created from the second diffusion node 38 toward the buried photodiode 29.

The position of the drain switch 48, and therefore the number of electrons transferred toward the buried photodiode 29, depends on the electric current generated by the infrared photodiode 20.

The buried photodiode 29 thus accumulates electrons as a function of the intensity of the optical radiation received by the infrared photodiode 20.

Then, the transfer switch 26 is placed in the operating position, in which the buried photodiode 29 and the first diffusion node 24 are coupled. The electrons accumulated in the buried photodiode 29 are transferred toward the first diffusion node 24, then converted into voltage by the conversion circuit 28.

Figure 7:
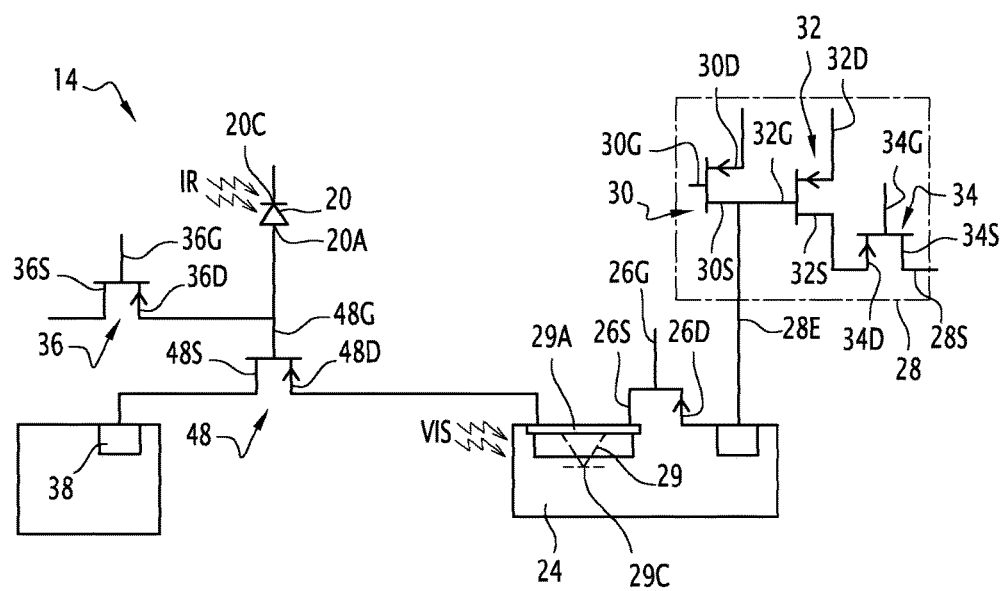

According to a sixth embodiment as shown in FIG. 7, the pixel 14 comprises the same elements as the pixel 14 of FIG. 6.

The pixel 14 further comprises a reset switch 36.

The reset switch 36 is a MOSFET transistor.

The drain 36D of the reset switch 36 is connected to the anode 20A of the infrared photodiode 20 and to the gate 48G of the drain switch 48.

The operation of the pixel 14 shown in FIG. 7 is similar to the operation of the pixel 14 shown in FIG. 6.

Furthermore, the reset switch 36 makes it possible to reset the infrared photodiode 20 when the electrons accumulated in the buried photodiode 29 are converted into voltage by the conversion circuit 28.

This prevents accumulation in the infrared photodiode 20 of stray electrons not converted into accumulated electrons in the buried photodiode 29.

Figure 8:
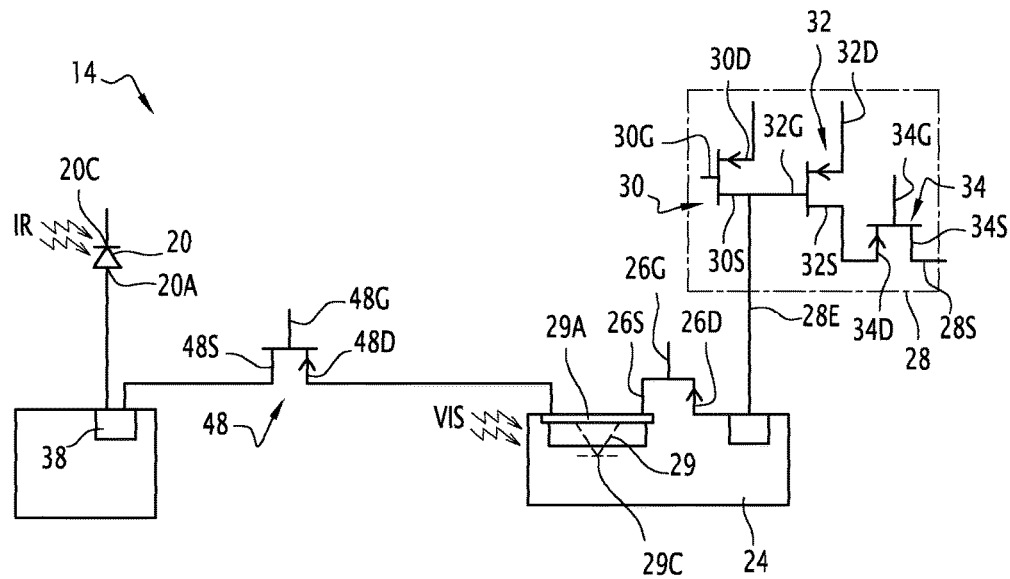

According to a seventh embodiment as shown in FIG. 8, the elements identical to the pixel 14 according to the fifth embodiment of FIG. 6 are not repeated. Only the differences are discussed.

In this seventh embodiment, the anode 20A of the infrared photodiode 20 is connected to the second diffusion node 38 instead of being connected to the gate 48G of the drain switch 48.

The operation of the pixel 14 shown in FIG. 8 will now be described.

An optical radiation having a wavelength comprised between 950 nm and 1700 nm illuminates the infrared photodiode 20.

In response, the infrared photodiode 20 generates an electric current proportional to the intensity of the received optical radiation.

The generated electric current is injected at the second diffusion node 38.

Electrons accumulate in the second diffusion node 38.

Then, the drain switch 48 is placed in the closed position. An electron transfer is then created from the second diffusion node 38 toward the buried photodiode 29.

The number of electrons transferred toward the buried photodiode 29 thus depends on the electric current generated by the infrared photodiode 20.

The drain switch 26 is next placed in the closed position. The first diffusion node 24 and the buried photodiode 29 being connected, an electron transfer is created from the buried photodiode 29 toward the first diffusion node 24.

The number of electrons transferred toward the first diffusion node 42 depends on the electric current generated by the infrared photodiode 20.

The first diffusion node 24 thus accumulates electrons as a function of the intensity of the optical radiation received by the infrared photodiode 20.

These accumulated electrons are next converted into voltage by the conversion circuit 28.

Figure 9:
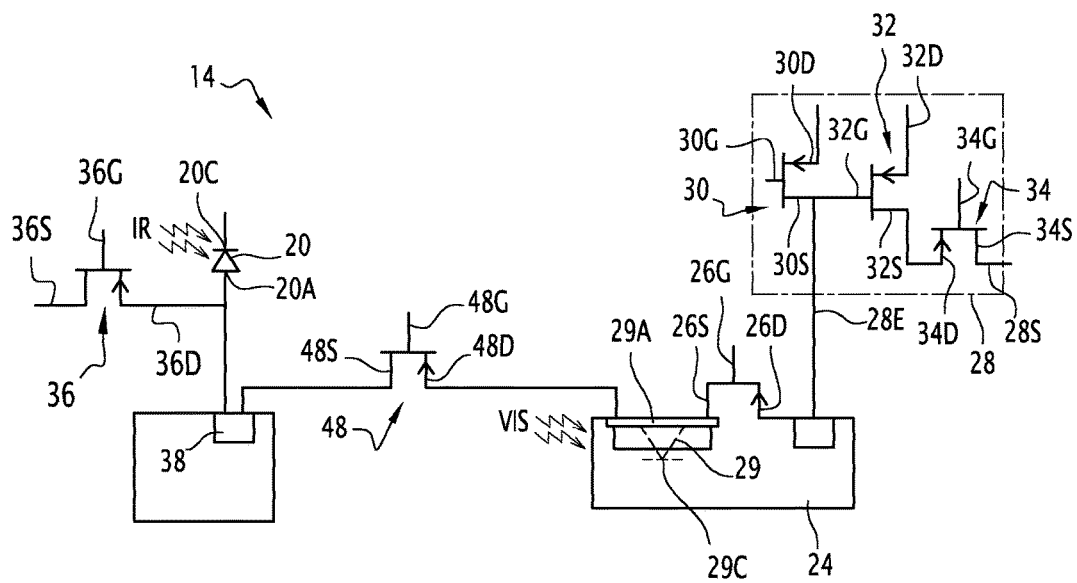

According to an eighth embodiment as shown in FIG. 9, the pixel 14 comprises the same elements as the pixel 14 according to the seventh embodiment described in light of FIG. 7.

The pixel 14 further comprises a reset switch 36.

The reset switch 36 is a MOSFET transistor.

The drain 36D of the reset switch 36 is connected to the anode 20A of the infrared photodiode 20 and the second diffusion node 38.

The operation of the pixel 14 shown in FIG. 9 is similar to the operation of the pixel 14 shown in FIG. 8.

Furthermore, the reset switch 36 makes it possible to reset the infrared photodiode 20 to recondition (i.e., reset) the load transfer conditions from the visible photodiode to the first diffusion node 24 before the conversion of the accumulated electrons into voltage by the conversion circuit 28.

This prevents accumulation in the infrared photodiode 20 of stray electrons not converted into accumulated electrons in the first diffusion node 24. In all of the described embodiments, the transfer switch 26 is connected between the infrared photodiode 20 and the conversion circuit 28. This makes it possible to ensure a separation between the read function of the current generated by the infrared photodiode 20 and the conversion function of the current generated by the infrared photodiode 20. This separation results in a decrease of the noise present during the read function. Noise performance as low as several electrons can be obtained.

Furthermore, for all of the embodiments, it is also alternatively possible to use the infrared photodiode 20 with the inverse polarity. As an example, in the alternative associated with the first embodiment, this means that the cathode 20C is connected to the gate 26G of the drain switch 26 instead of the anode 20A.

The invention claimed is:

1. A pixel of a CMOS imager, the pixel comprising:
an infrared photodiode suitable for generating an electric current when it is exposed to an optical radiation having a wavelength greater than 950 nanometers;
a conversion circuit for receiving electrons and delivering a voltage with a value varying as a function of the number of received electrons;
a first switch connected between the infrared photodiode and the conversion circuit;
an electron reservoir that is a buried photodiode; and
a first diffusion node connected between the first switch and the conversion circuit;
wherein the first switch is movable between an open position and a closed position, and the electron reservoir and the first diffusion node are connected in the closed position of the first switch.

2. The pixel according to claim 1, wherein the infrared photodiode has no silicon.

3. The pixel according to claim 1 wherein the infrared photodiode is made from a semiconductor made of materials belonging to the columns IIIA and VA of the periodic table.

4. The pixel according to claim 1, wherein the infrared photodiode comprises two electrodes, one of the two electrodes being connected to the electron reservoir.

5. The pixel according to claim 1, wherein the infrared photodiode comprises two electrodes, and the first switch comprises a control input of the first switch, wherein one of the two electrodes of the infrared photodiode is connected to the control input of the first switch.

6. The pixel according to claim 1, wherein the pixel further comprises a second switch connected between the infrared photodiode and the buried photodiode.

7. The pixel according to claim 6, wherein the pixel further comprises a second diffusion node connected between the infrared photodiode and the second switch, wherein the second switch is movable between an open position and a closed position, and the electron reservoir and the second diffusion node are connected in the closed position.

8. A CMOS imager comprising at least one pixel that comprises:
an infrared photodiode suitable for generating an electric current when it is exposed to an optical radiation having a wavelength greater than 950 nanometers;
a conversion circuit for receiving electrons and delivering a voltage with a value varying as a function of the number of received electrons;
a first switch connected between the infrared photodiode and the conversion circuit;

an electron reservoir that is a buried photodiode; and
a first diffusion node connected between the first switch and the conversion circuit;
wherein the first switch is movable between an open position and a closed position, and the electron reservoir and the first diffusion node are connected in the closed position of the first switch.

9. The CMOS imager according to claim 8 comprising a plurality of such pixels.

10. The CMOS imager of claim 9, wherein each infrared photodiode comprises two electrodes, one of the two electrodes being connected to the electron reservoir.

11. The CMOS imager of claim 9, wherein each infrared photodiode comprises two electrodes, and each first switch comprises a control input of the first switch, wherein one of the two electrodes of the infrared photodiode is connected to the control input of the first switch.

12. The CMOS imager of claim 9, wherein each pixel further comprises a second switch connected between the infrared photodiode and the buried photodiode.

13. The CMOS imager of claim 12, wherein each pixel further comprises a second diffusion node connected between the infrared photodiode and the second switch, wherein the second switch is movable between an open position and a closed position, and the electron reservoir and the second diffusion node are connected in the closed position.

14. The CMOS imager of claim 9, wherein each infrared photodiode is made from a semiconductor made of materials belonging to the columns IIIA and VA of the periodic table.

15. The CMOS imager of claim 9, wherein each infrared photodiode has no silicon.

16. The camera of claim 15, wherein each infrared photodiode has no silicon.

17. The camera of claim 15, wherein each infrared photodiode is made from a semiconductor made of materials belonging to the columns IIIA and VA of the periodic table.

18. The camera of claim 15, wherein each infrared photodiode comprises two electrodes, one of the two electrodes being connected to the electron reservoir.

19. The camera of claim 15, wherein each infrared photodiode comprises two electrodes, and each first switch comprises a control input of the first switch, wherein one of the two electrodes of the infrared photodiode is connected to the control input of the first switch.

20. The camera of claim 15, wherein each pixel further comprises a second switch connected between the infrared photodiode and the buried photodiode.

21. The camera of claim 20, wherein each pixel further comprises a second diffusion node connected between the infrared photodiode and the second switch, wherein the second switch is movable between an open position and a closed position, and the electron reservoir and the second diffusion node are connected in the closed position.

22. A camera comprising at least one CMOS imager that comprises at least one pixel that comprises:
an infrared photodiode suitable for generating an electric current when it is exposed to an optical radiation having a wavelength greater than 950 nanometers;
a conversion circuit for receiving electrons and delivering a voltage with a value varying as a function of the number of received electrons;
a first switch connected between the infrared photodiode and the conversion circuit;
an electron reservoir that is a buried photodiode; and
a first diffusion node connected between the first switch and the conversion circuit;
wherein the first switch is movable between an open position and a closed position, and the electron reservoir and the first diffusion node are connected in the closed position of the first switch.

23. The camera of claim 22 comprising a plurality of such CMOS imagers.

* * * * *